(12) United States Patent
Morohoshi

(10) Patent No.: US 10,059,045 B2
(45) Date of Patent: Aug. 28, 2018

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Hiroshi Morohoshi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 428 days.

(21) Appl. No.: 14/717,226

(22) Filed: May 20, 2015

(65) Prior Publication Data
US 2015/0343679 A1 Dec. 3, 2015

(30) Foreign Application Priority Data
Jun. 2, 2014 (JP) .................................. 2014-114366

(51) Int. Cl.
| | |
|---|---|
| *B29C 43/58* | (2006.01) |
| *B29C 59/02* | (2006.01) |
| *B29C 43/18* | (2006.01) |
| *G03F 7/00* | (2006.01) |

(52) U.S. Cl.
CPC .............. *B29C 43/58* (2013.01); *B29C 43/18* (2013.01); *G03F 7/0002* (2013.01)

(58) Field of Classification Search
USPC ............................. 264/40.1, 293; 425/174.4
See application file for complete search history.

(56) References Cited

U.S. PATENT DOCUMENTS

| | | |
|---|---|---|
| 2008/0013089 A1 | 1/2008 | Ishii et al. |
| 2011/0290136 A1 | 12/2011 | Koga |
| 2012/0217675 A1* | 8/2012 | Usui ...................... B82Y 10/00 |
| | | 264/293 |

(Continued)

FOREIGN PATENT DOCUMENTS

| | | |
|---|---|---|
| JP | 4250252 B2 | 4/2009 |
| JP | 2011253839 A | 12/2011 |

(Continued)

OTHER PUBLICATIONS

Notice of Preliminary Rejection issued in Korean Appln. No. 10-2015-0077127 dated Mar. 6, 2017.

(Continued)

*Primary Examiner* — Nahida Sultana
(74) *Attorney, Agent, or Firm* — Rossi, Kimms & McDowell LLP

(57) ABSTRACT

The present invention provides an imprint apparatus that forms an imprint material supplied on a shot region of a substrate by using a mold, comprising a detection unit configured to detect each mark provided to the shot region and each mark provided to the mold, and a control unit configured to perform alignment between the mold and the substrate based on a detection result by the detection unit, wherein the control unit obtains a predicted value of a position of a mark provided to the shot region by using information about deformation of the shot region, determines, as an abnormal mark, a mark for which a difference between the detection result and the predicted value does not fall within an allowable range and performs the alignment without using the detection result for the abnormal mark.

9 Claims, 5 Drawing Sheets

(56) References Cited

U.S. PATENT DOCUMENTS

| | | | | |
|---|---|---|---|---|
| 2012/0321797 A1* | 12/2012 | Kurosawa | ............. | G03F 7/0002 |
| | | | | 427/264 |
| 2013/0156879 A1* | 6/2013 | Lee | ...................... | B29C 59/026 |
| | | | | 425/385 |
| 2016/0064214 A1* | 3/2016 | Fujisawa | ............... | G03F 7/0002 |
| | | | | 438/703 |
| 2016/0136872 A1* | 5/2016 | Yanagisawa | .......... | G03F 7/0002 |
| | | | | 264/40.1 |
| 2016/0299444 A1* | 10/2016 | Komaki | ................ | G03F 7/0002 |
| 2017/0008219 A1* | 1/2017 | Asano | .................... | G03F 7/0002 |
| 2017/0329217 A1* | 11/2017 | Minoda | .................... | G01D 5/38 |
| 2018/0011400 A1* | 1/2018 | Shiode | ................... | B82Y 40/00 |
| 2018/0045656 A1* | 2/2018 | Tsuchiya | ............. | G01N 21/956 |

FOREIGN PATENT DOCUMENTS

| | | | |
|---|---|---|---|
| JP | 2013511826 A | 4/2013 | |
| JP | 2013243315 A | 12/2013 | |
| JP | 2014053495 A | 3/2014 | |
| KR | 1020110132238 A | 12/2011 | |
| WO | 2006025386 A1 | 3/2006 | |
| WO | 2011064020 A1 | 6/2011 | |

OTHER PUBLICATIONS

Office Action issued in Japanese Appln. No. 2014-114366 dated Feb. 23, 2018.

* cited by examiner

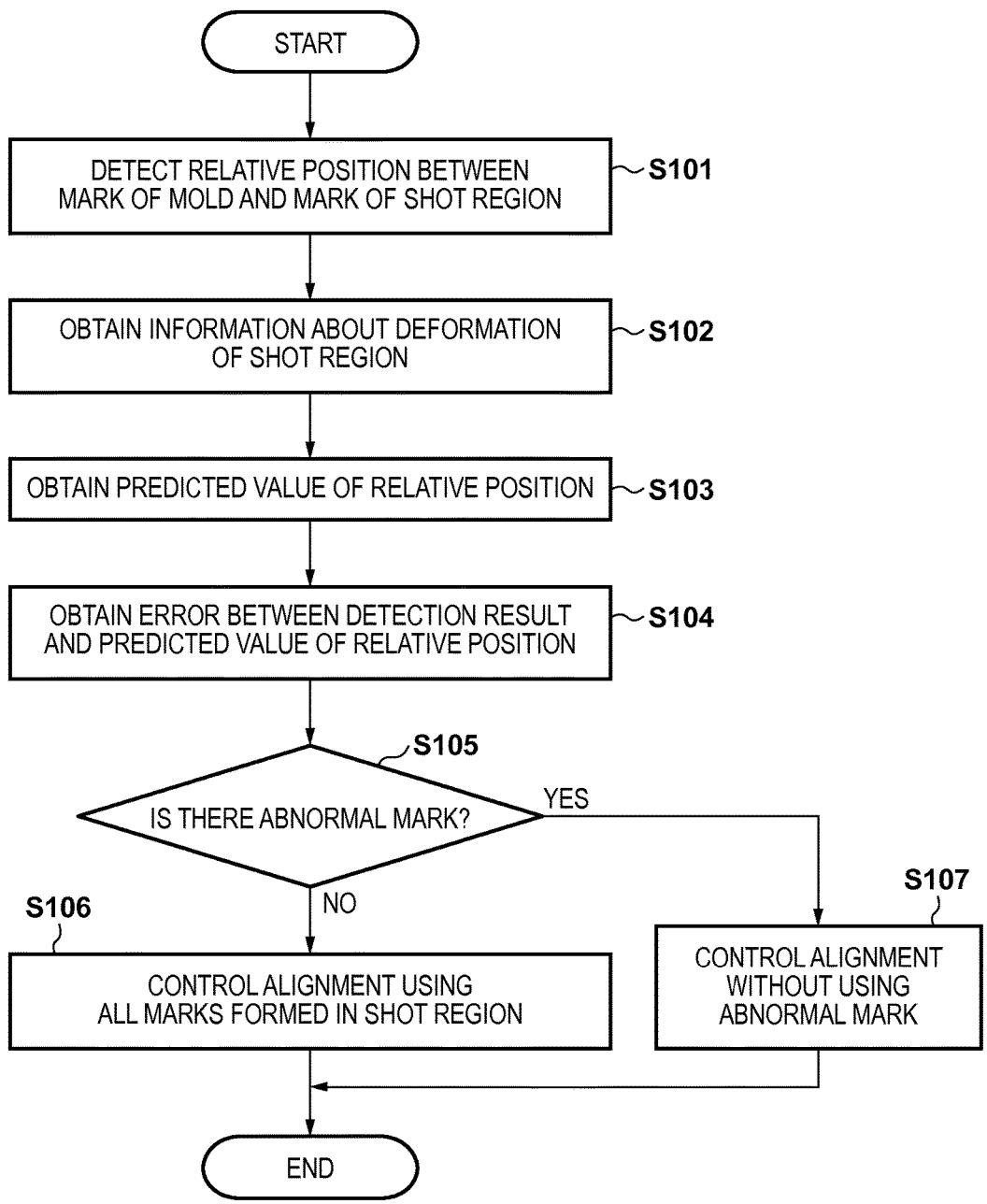

TEMPERATURE CHANGE OF SUBSTRATE

FEM ANALYSIS RESULT

ΔX = θ*L

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus that forms an imprint material supplied on a shot region of a substrate by using a mold has received attention as one of mass production lithography apparatuses for semiconductor devices and the like. The imprint apparatus generally employs a die-by-die alignment method as an alignment method for a substrate and a mold (see Japanese Patent Laid-Open No. 2013-243315). The die-by-die alignment method is a method of detecting, for each shot region on a substrate, a relative position between each mark provided to a mold and each mark provided to the shot region, and performing alignment between a pattern region on the mold and the shot region based on the detection result.

A plurality of marks provided to a shot region on a substrate sometimes include a mark (abnormal mark) formed at a position or with a shape different from one at or with which the mark should be formed originally. In this case, if the alignment is performed so that the relative position between the abnormal mark and a corresponding mark of the mold becomes a target relative position, a position deviation may be generated between the pattern region on the mold and the shot region. That is, it may become difficult to transfer the pattern of the mold to the shot region with high accuracy.

SUMMARY OF THE INVENTION

The present invention provides an imprint apparatus advantageous for, for example, performing alignment between a substrate and a mold.

According to one aspect of the present invention, there is provided an imprint apparatus that forms an imprint material supplied on a shot region of a substrate by using a mold, comprising: a detection unit configured to detect each of a plurality of marks provided to the shot region and each of a plurality of marks provided to the mold; and a control unit configured to perform alignment between the mold and the substrate based on a detection result by the detection unit, wherein the control unit obtains a predicted value of a position of a mark provided to the shot region by using information about deformation of the shot region, determines, as an abnormal mark, a mark for which a difference between the detection result and the predicted value does not fall within an allowable range, out of the plurality of marks provided to the shot region, and performs the alignment without using the detection result for the abnormal mark.

Further features of the present invention will become apparent from the following description of exemplary embodiments with reference to the attached drawings.

BRIEF DESCRIPTION OF THE DRAWINGS

FIG. 4 is a flowchart showing a control method of alignment accompanied by determination of an abnormal mark;

DESCRIPTION OF THE EMBODIMENTS

Figure 1:
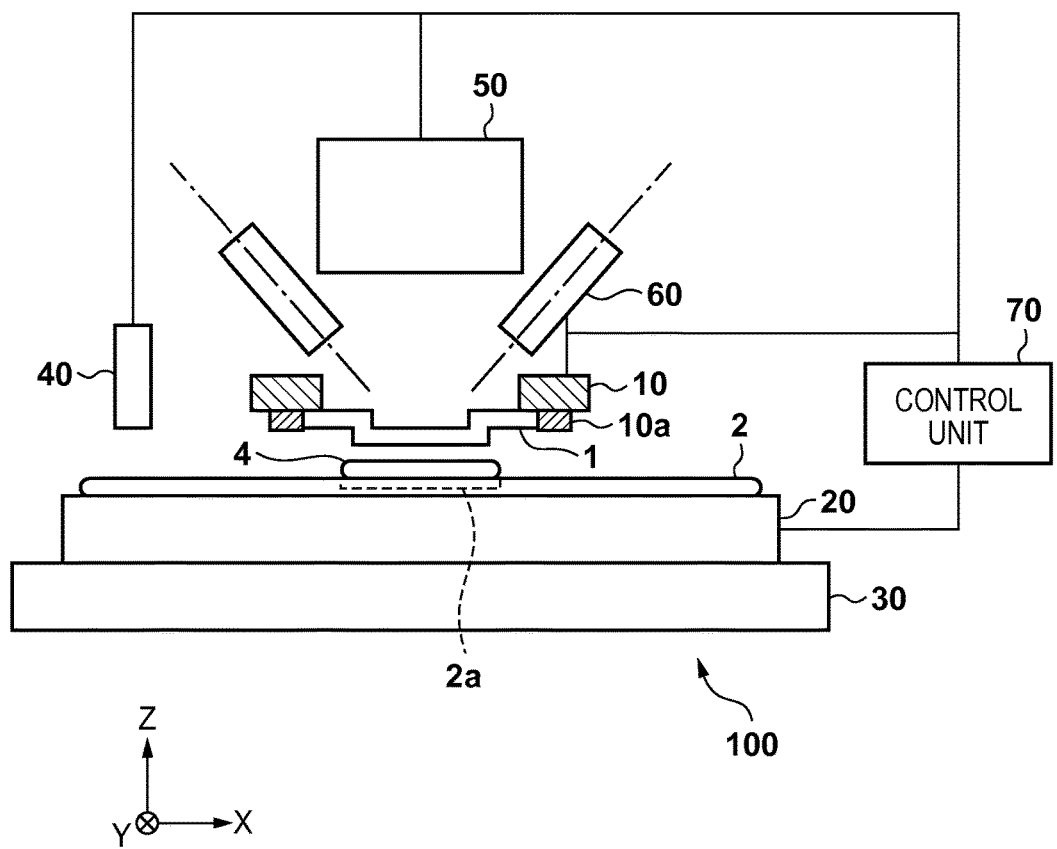
FIG. 1 is a schematic view showing the arrangement of an imprint apparatus according to the first embodiment.

Exemplary embodiments of the present invention will be described below with reference to the accompanying drawings. Note that the same reference numerals denote the same members throughout the drawings, and a repetitive description thereof will not be given. In the following description, "alignment" includes to make the relative position of a pattern region on a mold and that of a shot region on a substrate in the X and Y directions match each other, and to make the shape of the pattern region and that of the shot region match each other.

First Embodiment

An imprint apparatus 100 according to the first embodiment of the present invention will be explained. The imprint apparatus 100 is used to manufacture a semiconductor device or the like, and performs an imprint process of forming an imprint material 4 on a substrate by using a mold 1. For example, the imprint apparatus 100 cures the imprint material 4 in a state in which the mold 1, on which an unevenness pattern (a concave-convex pattern) is formed, contacts the imprint material 4 on the substrate. Then, the imprint apparatus 100 widens the interval between the mold 1 and a substrate 2, separates (releases) the mold 1 from the cured imprint material 4, and thus can form the pattern from the imprint material 4 on the substrate. Methods of curing the imprint material 4 include a heat cycle method using heat and a photo-curing method using light. The first embodiment will explain an example in which the photo-curing method is employed. The photo-curing method is a method of supplying an uncured ultraviolet-curing resin as the imprint material 4 onto a substrate, and irradiating the imprint material 4 with ultraviolet rays in a state in which the mold 1 and the imprint material 4 contact each other, thereby curing the imprint material 4. Although an example in which ultraviolet rays are used as light will be explained, light of a wavelength different from that of ultraviolet rays may also be used.

[Arrangement of Imprint Apparatus 100]

FIG. 1 is a schematic view showing the arrangement of the imprint apparatus 100 according to the first embodiment. The imprint apparatus 100 can include an imprint head 10 that holds the mold 1, a substrate stage 20 that holds the substrate 2, and an irradiation unit 50 that irradiates the imprint material 4 on the substrate with light (ultraviolet rays). The imprint apparatus 100 can include a supply unit 40 that supplies the imprint material 4 to the substrate 2, a detection unit 60 that detects a relative position between a mark provided to the mold 1 and a mark provided to a shot region 2a of the substrate, and a control unit 70. The control unit 70 includes, for example, a CPU, a memory, and the like, and controls the imprint process (controls each unit of the imprint apparatus 100).

The mold 1 is generally made of a material capable of transmitting ultraviolet rays, such as quartz. An unevenness pattern (a concave-convex pattern) for forming the imprint material 4 on the substrate is formed in a partial region (pattern region) on the substrate-side surface. The substrate 2 can be, for example, a single-crystal silicon substrate or an SOI (Silicon On Insulator) substrate. The supply unit 40 (to be described later) supplies the imprint material 4 onto the upper surface (surface to be processed) of the substrate 2.

The imprint head 10 holds the mold 1 by a vacuum chuck force, an electrostatic force, or the like, and drives the mold 1 in the Z direction so as to bring a pattern region on the mold and the imprint material 4 on the substrate into contact with each other or separate them. The imprint head 10 may have not only a function of driving the mold 1 in the Z direction, but also, for example, an adjustment function of adjusting the position of the mold 1 in the X and Y directions and the θ direction (rotational direction around the Z-axis), and a tilt function of correcting the tilt of the mold 1.

The imprint apparatus 100 can include a deformation unit that deforms at least one of a pattern region on the mold and the shot region 2a so that the shape of the shot region 2a and that of the pattern region come close to each other. The deformation unit in the first embodiment can include, for example, a plurality of actuators 10a that are arranged in the imprint head 10 so as to add a force to a plurality of portions on the respective side surfaces of the mold 1. The plurality of actuators 10a in the deformation unit individually add a force to a plurality of portions on the respective side surfaces of the mold 1, and thus can deform the pattern region so that the shape of the shot region 2a and that of the pattern region on the mold come close to each other. Each actuator 10a in the deformation unit can be, for example, a linear motor, an air cylinder, a piezoelectric actuator, or the like. The deformation unit according to the first embodiment is configured to deform the pattern region on the mold, but may be configured to deform the shot region 2a on the substrate. In this case, the deformation unit can include a mechanism that deforms the shot region 2a by irradiating the surface of the substrate 2 with light and thermally expanding the substrate 2 so that the shape of the shot region 2a and that of the pattern region of the mold 1 come close to each other. The deformation unit may also be configured to deform both the pattern region on the mold and the shot region 2a.

The substrate stage 20 holds the substrate 2 by a vacuum chuck force, an electrostatic force, or the like, and moves on a base 30 in the X and Y directions to align the substrate 2 in the X and Y directions. The substrate stage 20 may have not only a function of moving the substrate 2 in the X and Y directions, but also a function of moving the substrate 2 in the Z direction, and an adjustment function of adjusting the position of the substrate 2 in the θ direction. In the imprint apparatus 100 according to the first embodiment, the imprint head 10 performs an operation of changing the distance between the mold 1 and the substrate 2. However, the present invention is not limited to this, and the distance may be changed by driving the substrate stage 20, by simultaneously driving both the imprint head 10 and the substrate stage 20, or by sequentially driving them.

At the time of the imprint process, the irradiation unit 50 irradiates the imprint material 4 supplied to the substrate 2 with light (ultraviolet rays), and cures the imprint material 4. The irradiation unit 50 includes, for example, a light source that emits light (ultraviolet rays) for curing the imprint material 4. Further, the irradiation unit 50 may include an optical element for adjusting light emitted by the light source into light appropriate for the imprint process. Since the photo-curing method is employed in the first embodiment, the light source that emits ultraviolet rays is used. However, for example, when a thermosetting method is employed, a heat source for curing a thermosetting resin serving as the imprint material 4 can be used instead of the light source. The supply unit 40 supplies the imprint material 4 (uncured resin) onto the substrate. As described above, in the imprint apparatus 100 according to the first embodiment, an ultraviolet-curing resin having a property in which it is cured by irradiation with ultraviolet rays is used as the imprint material 4.

Figure 2:
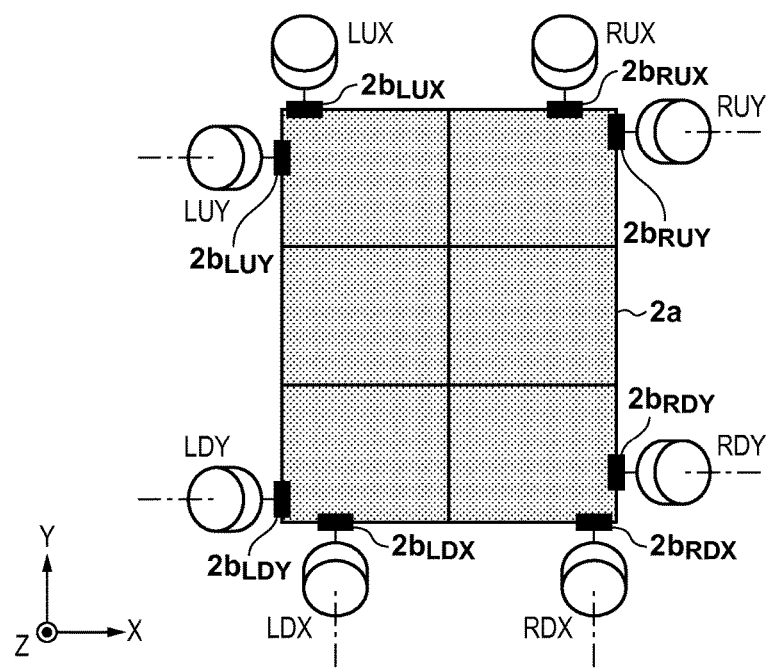
FIG. 2 is a view showing the arrangement of marks in a shot region and the arrangement of scopes in a detection unit.

The detection unit 60 detects a relative position between each of a plurality of marks 2b formed in the shot region 2a on the substrate and each of a plurality of marks formed on the mold. The detection unit 60 can include, for example, a plurality of scopes arranged so that the plurality of marks 2b formed in the shot region 2a can be observed simultaneously. For example, a case will be assumed, in which the mark 2b for detecting a relative position in the X direction and the mark 2b for detecting a relative position in the Y direction are formed at each of the four corners of the shot region 2a, as shown in FIG. 2. In this case, the detection unit 60 can include eight scopes arranged to be able to simultaneously detect eight marks formed in the shot region 2a. Scopes LUX, LUY, LDX, and LDY are arranged so that they can observe marks $2b_{LUX}$, $2b_{LUY}$, $2b_{LDX}$, and $2b_{LDY}$, respectively. In addition, scopes RUX, RUY, RDX, and RDY are arranged so that they can observe marks $2b_{RUX}$, $2b_{RUY}$, $2b_{RDX}$, and $2b_{RDY}$, respectively.

Figure 3A:
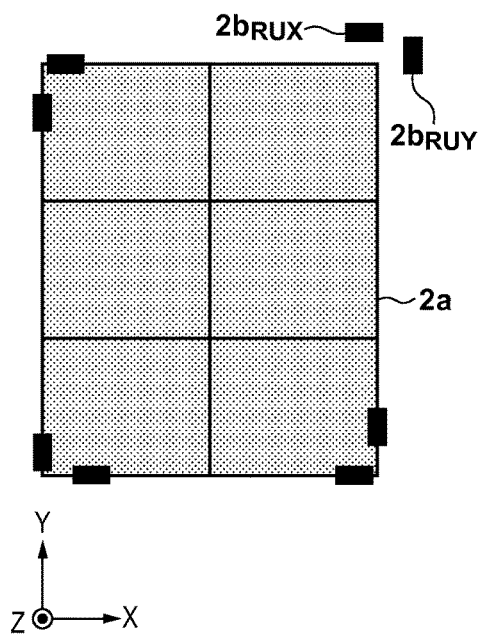
FIG. 3A is a view for explaining alignment between a substrate and a shot region when an abnormal mark exists in the shot region.
Figure 3B:
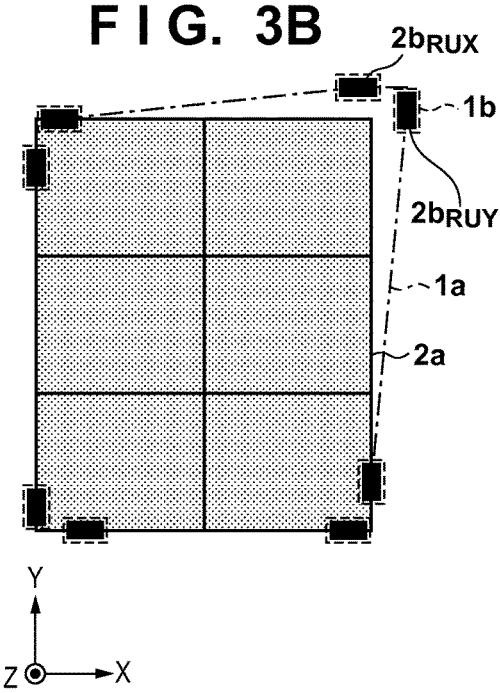
FIG. 3B is a view for explaining alignment between the substrate and the shot region when the abnormal mark exists in the shot region.

The plurality of marks 2b formed in the shot region 2a on the substrate in this manner sometimes include the mark 2b (abnormal mark) formed at a position or with a shape different from one at or with which the mark 2b should be formed originally. In this case, if alignment is performed so that the relative position between the abnormal mark and a corresponding mark of the mold becomes a target relative position, a position deviation may be generated between the pattern region on the mold and the shot region 2a. That is, it may become difficult to transfer the pattern of the mold to the shot region 2a with high accuracy. For example, a case will be assumed, in which the marks $2b_{RUX}$ and $2b_{RUY}$ are abnormal marks at positions different from those at which they should be formed originally, as shown in FIG. 3A. In this case, assume that the control unit 70 controls the deformation unit so that the relative position between each mark 2b of the shot region 2a and each mark 1b of the mold 1 becomes a target relative position, and performs alignment between the shot region 2a on the substrate and a pattern region 1a on the mold. Here, the target relative position is set so that the mark 2b of the shot region 2a and a corresponding mark 1b of the mold 1 overlap each other. At this time, even if the relative position between each mark 2b of the shot region 2a and each mark 1b of the mold 1 becomes the target relative position, a position deviation may be generated between the shot region 2a on the substrate and the pattern region 1a on the mold, as shown in FIG. 3B. That is, it may become difficult to transfer the pattern of the mold 1 to the shot region 2a with high accuracy.

To solve this, the imprint apparatus 100 according to the first embodiment obtains, for each mark 2b of the shot region 2a, the predicted value of the relative position between the mark 2b of the shot region 2a and the mark 1b of the mold 1 by using information about the deformation of the shot region 2a. The imprint apparatus 100 determines, as an abnormal mark, a mark for which an error (a difference) between the result of detection by the detection unit 60 and the predicted value does not fall within an allowable range, out of the plurality of marks 2b formed in the shot region 2a. Then, the imprint apparatus 100 controls alignment between the mold 1 and the shot region 2a without using the detection result for the abnormal mark (the mark does not fall within the allowable range). A control method of alignment accompanied by determination of an abnormal mark will be described below.

[Control Method of Alignment Accompanied by Determination of Abnormal Mark]

The control method of alignment accompanied by determination of an abnormal mark will be explained with reference to FIG. 4. FIG. 4 is a flowchart showing the control method of alignment accompanied by determination of an abnormal mark. In step S101, the control unit 70 controls the detection unit 60 to detect a relative position between the mark 1b of the mold 1 and the mark 2b of the shot region 2a. For example, letting $lux_i$ be a detection result in the mark $2b_{LUX}$ of the ith shot region 2a, and $luy_i$ be a detection result in the mark $2b_{LUY}$, the detection results $lux_i$ and $luy_i$ are given by equations (1):

$$lux_i = Xs_i + Xm_i \times X_{lux} + Xr_i \times Y_{lux}$$

$$luy_i = Ys_i + Ym_i \times Y_{lux} + Yr_i \times X_{lux} \quad (1)$$

where $Xs_i$ is the shift component of the ith shot region 2a in the X direction, $Ys_i$ is the shift component of the ith shot region 2a in the Y direction, $Xm_i$ is the magnification component of the ith shot region 2a in the X direction, $Ym_i$ is the magnification component of the ith shot region 2a in the Y direction, $Xr_i$ is the rotation component of the ith shot region 2a in the X direction, and $Yr_i$ is the rotation component of the ith shot region 2a in the Y direction. Xr and Yr are positive (+) in the clockwise direction (CW direction). $(X_{lux}, Y_{lux})$ are the coordinates of the mark $2b_{LUX}$ in the shot region.

Similarly, the detection result of another mark 2b formed in the shot region 2a can also be represented by a shift component, magnification component, and rotation component in the ith shot region 2a, and the coordinates of each mark 2b. By solving simultaneous equations for each mark 2b by using the least-square method, the shift component, magnification component, and rotation component in the ith shot region 2a can be obtained from a detection result for each mark 2b.

In step S102, the control unit 70 obtains information about the deformation of the shot region 2a. The information about the deformation of the shot region 2a includes, for example, at least one of the deformation amount of the shot region 2a generated when forming the mark 2b on the substrate 2, the deformation amount of the shot region 2a upon a temperature change of the substrate 2, and the deformation amount of the shot region 2a by holding the substrate 2.

The deformation amount of the shot region 2a generated when forming the mark 2b on the substrate 2 is, for example, the deformation amount of the shot region 2a arising from the driving error of the substrate stage in an apparatus (for example, an exposure apparatus) that forms the mark 2b on the substrate 2. The deformation amount arising from the driving error of the substrate stage can be obtained in advance by using a dummy substrate on which the plurality of shot regions 2a are formed so that the adjacent shot regions 2a partially overlap each other, as described in, for example, Japanese Patent No. 4250252. Accordingly, the deformation amount (shift components $dx_{is}$ and $dy_{is}$, and rotation components $d\theta x_{is}$ and $d\theta y_{is}$) of the shot region 2a arising from the driving error of the substrate stage in the apparatus that forms the mark 2b on the substrate 2 is obtained. The magnification component of the shot region 2a cannot be obtained by the above-described method. However, variations of the magnification component of the shot region 2a are suppressed to be sufficiently small in a recent exposure apparatus, so the magnification component need not be considered.

Figure 5A:
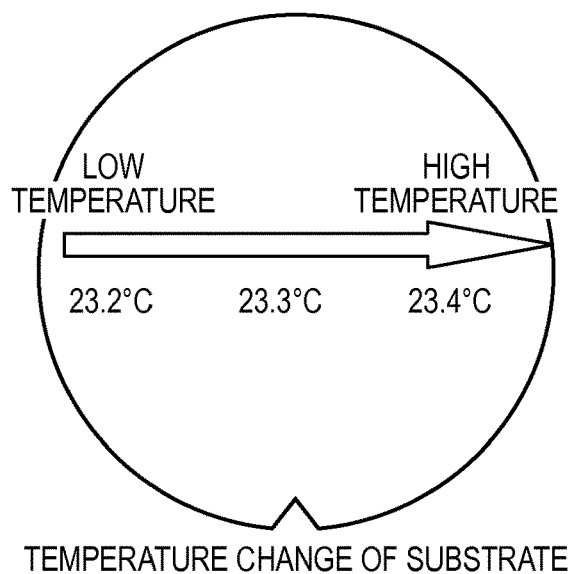
FIG. 5A is a view for explaining the deformation of each shot region upon a temperature change of the substrate.
Figure 5B:
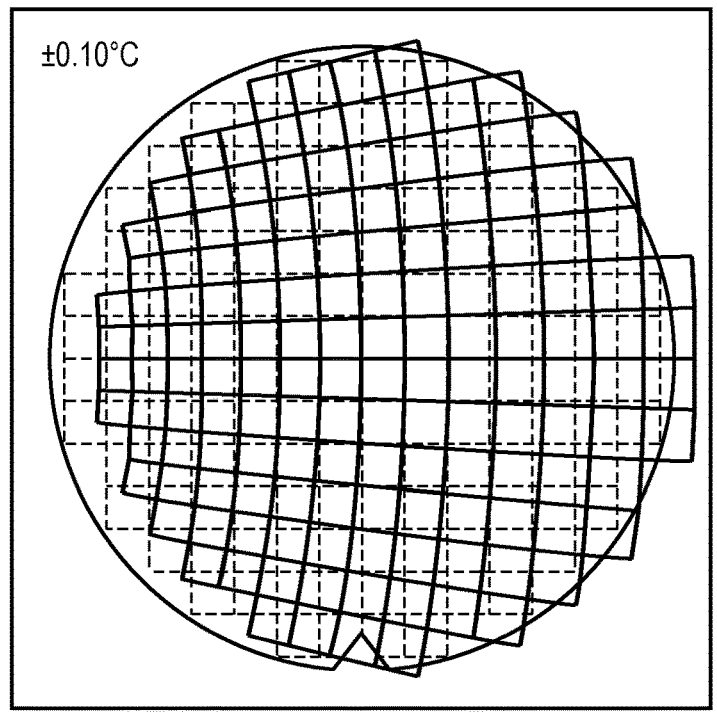
FIG. 5B is a view for explaining the deformation of each shot region upon a temperature change of the substrate.

The thermal deformation amount of the shot region 2a upon a temperature change of the substrate 2 is generated by a temperature change of the substrate 2 in, for example, a step after forming the mark 2b on the substrate 2. If the coefficient of thermal expansion is known, this thermal deformation amount can be obtained in advance by FEM analysis or the like using the temperature change amount of the substrate 2. FIGS. 5A and 5B are views showing an example of the FEM analysis result (the deformation amount of each shot region 2a) when a temperature change occurs in the substrate 2. FIG. 5A is a view showing a temperature change of the substrate 2, and FIG. 5B is a view showing the FEM analysis result. Hence, the thermal deformation amount (shift components $dx_{ih}$ and $dy_{ih}$, magnification components $dmx_{ih}$ and $dmy_{ih}$, and rotation components $d\theta x_{ih}$ and $d\theta y_{ih}$) of the shot region 2a upon a temperature change of the substrate 2 is obtained.

Figure 6:
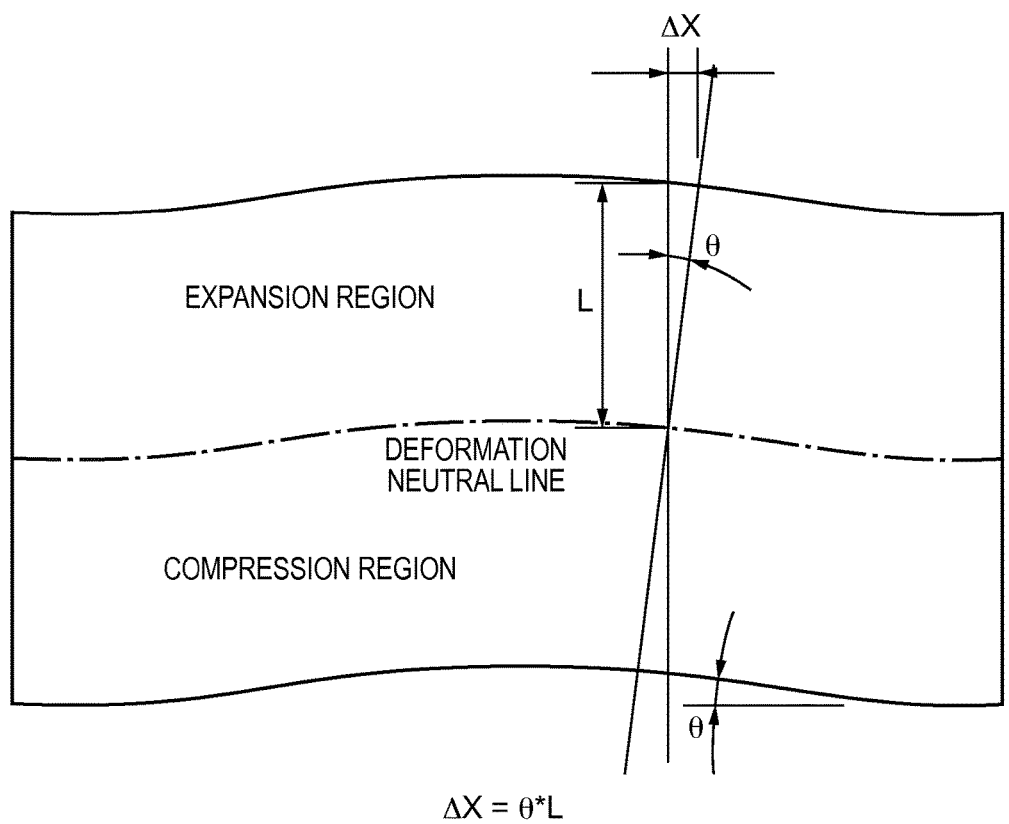
FIG. 6 is a view for explaining the deformation of each shot region by holding the substrate.

The deformation amount of the shot region 2a by holding the substrate 2 is generated when the substrate stage 20 holds the substrate 2. If the rigidity coefficient of the substrate 2 is known, this deformation amount can be obtained in advance by FEM analysis or the like using the flatness of the substrate stage 20. If a flatness θ of the substrate stage 20 is known, a deformation amount ΔX (=θ×L) of the shot region 2a can also be obtained in advance by simple approximate calculation from the flatness θ and the thickness 2 L of the substrate 2, as shown in FIG. 6. As a result, the deformation amount (shift components $dx_{iv}$ and $dy_{iv}$, magnification components $dmx_{iv}$ and $dmy_{iv}$, and rotation components $d\theta x_{iv}$ and $d\theta y_{iv}$) of the shot region 2a by holding the substrate 2 by the substrate stage 20 is obtained.

In step S103, the control unit 70 obtains the predicted value of the relative position between the mark 1b of the mold 1 and the mark 2b of the shot region 2a by using the information about the deformation of the shot region 2a that has been obtained in step S102. For example, first, the control unit 70 obtains the predicted values (shift component, magnification component, and rotation component) of the deformation amount in the ith shot region 2a by using the information about the deformation of the shot region 2a that has been obtained in step S102. Of the predicted values of the deformation amount in the ith shot region 2a, the shift component will be represented by $Xs_i'$ and $Ys_i'$, the magnification component will be represented by $Xm_i'$ and $Ym_i'$, and the rotation component will be represented by $Xr_i'$ and $Yr_i'$. At this time, for example, the shift component (X direction) out of the predicted values of the deformation amount in the ith shot region 2a is given by:

$$Xs_i' = dx_{is} + dx_{ih} + dx_{iv} + dx_0 \quad (2)$$

In this case, a position deviation (shift components $dx_0$ and $dy_0$, and rotation components $d\theta x_0$ and $d\theta y_0$) along with loading of the substrate 2 onto the substrate stage 20 may be generated between the substrate 2 and the substrate stage 20. For this reason, the shift component $dx_0$ of the position deviation in the X direction is added to the predicted value (shift component $Xs_i'$) of the deformation amount in the ith shot region 2a that is given by equation (2). Such a position deviation may change in every loading of the substrate 2, that is, for every substrate 2, and it is difficult to apply a value obtained in advance. By utilizing the fact that the position deviation amounts in the plurality of shot regions 2a on the same substrate take almost the same value, the control unit 70 obtains the difference in the predicted value of the deformation amount between the two shot regions 2a on the same substrate. The position deviation along with loading of the substrate 2 can therefore be removed. For example, a difference $\Delta Xs_{ij}$ of the predicted value of the deformation amount is obtained between the ith shot region 2a and the jth adjacent shot region 2a (for example, (i−1)th shot region 2a):

$$\Delta Xs_{ij} = Xs_i' - Xs_j' \qquad (3)$$
$$= (dx_{is} + dx_{ih} + dx_{iv} + dx_0) - (dx_{js} + dx_{jh} + dx_{jv} + dx_0)$$
$$= (dx_{is} - dx_{js}) + (dx_{ih} - dx_{jh}) + (dx_{iv} - dx_{jv})$$

According to this method, the control unit 70 obtains the difference of the predicted value of the deformation amount not only for the shift component $\Delta Xs_{ij}$ in the X direction, but also for a shift component $\Delta Ys_{ij}$ in the Y direction, magnification components $\Delta Xm_{ij}$ and $\Delta Ym_{ij}$, and rotation components $\Delta Xr_{ij}$ and $\Delta Yr_{ij}$. By using the differences of the predicted values of the deformation amount, the control unit 70 can obtain the predicted value of the relative position between the mark 1b of the mold 1 and the mark 2b of the shot region 2a for each mark 2b in the shot region. The predicted value of the relative position obtained in this fashion is almost the same between the plurality of substrates 2 in the same lot. Thus, the control unit 70 may use the obtained predicted value commonly for the plurality of substrates 2.

In step S104, the control unit 70 obtains, for each mark 2b in the shot region, the difference between the result of the detection by the detection unit 60 that has been obtained in step S101, and the predicted value of the relative position that has been obtained in step S103. In step S105, the control unit 70 determines whether the mark 2b for which the difference obtained in step S104 does not fall within the allowable range exists in the plurality of marks 2b formed in the shot region 2a. The control unit 70 determines, as an abnormal mark, the mark 2b for which the difference does not fall within the allowable range. Although the allowable range can be arbitrarily set, the allowable range may be set based on experiment, the history of previous imprint processes, or the like. If the control unit 70 determines in step S105 that no abnormal mark exists, the process advances to step S106, and the control unit 70 controls alignment between the mold 1 and the shot region 2a by using all the marks 2b formed in the shot region 2a. To the contrary, if the control unit 70 determines in step S105 that an abnormal mark exists, the process advances to step S107, and the control unit 70 controls alignment between the pattern region 1a on the mold and the shot region 2a without using the detection result for the abnormal mark.

A method of controlling alignment between the pattern region 1a on the mold and the shot region 2a in step S107 without using the abnormal mark will be explained here. The control unit 70 may perform alignment based on, for example, a result of a detection by the detection unit 60 for the mark 2b other than the abnormal mark, out of the plurality of marks 2b formed in the shot region 2a. This can suppress a position deviation between the pattern region 1a on the mold and the shot region 2a that is generated upon performing alignment so that the relative position between the abnormal mark and the mark 1b of the mold 1 becomes a target relative position. The control unit 70 may perform the alignment by using a detection result for another mark, instead of a detection result for the abnormal mark. The other mark can be a mark that is formed in the shot region 2a (second shot region) to undergo the imprint process before the shot region 2a (first shot region) having the abnormal mark, and is arranged at the same position in the shot region as that of the abnormal mark. Alternatively, the other mark can be a mark that is formed on a substrate having undergone the imprint process before the substrate 2 on which the shot region 2a having the abnormal mark is formed, and is arranged at the same position on the substrate as that of the abnormal mark. In this manner, by performing alignment using a detection result for another mark instead of a detection result for the abnormal mark, the pattern of the mold 1 can be transferred to the shot region 2a with high accuracy even if the shot region 2a has the abnormal mark.

As described above, for each mark 2b formed in the shot region 2a, the imprint apparatus 100 according to the first embodiment obtains the difference between the detection result of the relative position between the mark 1b of the mold 1 and the mark 2b of the shot region 2a, and the predicted value. The imprint apparatus 100 determines, as an abnormal mark, the mark 2b for which the obtained difference does not fall within the allowable range. The imprint apparatus 100 performs alignment between the mold 1 and the shot region 2a without using a detection result for the abnormal mark. As a result, the pattern of the mold can be transferred to the shot region 2a with high accuracy.

Second Embodiment

An imprint apparatus according to the second embodiment of the present invention will be explained. When the imprint apparatus according to the second embodiment determines an abnormal mark, it controls alignment for a shot region 2a having the abnormal mark in accordance with a mode selected from a plurality of modes. The imprint apparatus according to the second embodiment performs alignment between a mold 1 and the shot region 2a according to the flowchart shown in FIG. 4. The imprint apparatus according to the second embodiment is different from the imprint apparatus 100 according to the first embodiment in only step S107 of FIG. 4, so step S107 will be explained below.

In step S107, a control unit 70 controls alignment between the mold 1 and the shot region 2a without using a detection result for an abnormal mark. At this time, the control unit 70 controls the alignment in accordance with a mode selected from a plurality of modes. The selection of the mode can be performed by a user, for example, before the start of the imprint process or at a stage (after step S105) at which the abnormal mark is determined.

The plurality of modes can include at least one of the first, second, and third modes. The first mode is, for example, a mode in which alignment is performed based on a result of a detection by the detection unit 60 for a mark 2b other than an abnormal mark, out of a plurality of marks 2b formed in the shot region 2a. The second mode is, for example, a mode in which alignment is performed by using, instead of a detection result for an abnormal mark, a detection result for another mark formed in a shot region to undergo the imprint process before the shot region 2a having the abnormal mark. The other mark in the second mode may be formed in a shot region to undergo the imprint process before the shot region 2a having an abnormal mark, and be arranged at the same position in the shot region as that of the abnormal mark. The third mode is, for example, a mode in which alignment is performed by using, instead of a detection result for an abnormal mark, a detection result for another mark formed on a substrate having undergone the imprint process before a substrate 2 on which the shot region 2a having the abnormal mark is formed. The other mark in the third mode may be formed on a substrate having undergone the imprint process before the substrate 2 on which the shot region 2a having an abnormal mark is formed, and be arranged at the same position on the substrate as that of the abnormal mark.

As described above, the imprint apparatus according to the second embodiment controls alignment for the shot region 2a having an abnormal mark in accordance with a mode selected from a plurality of modes. Thus, alignment between the pattern region 1a on the mold and the shot region 2a when an abnormal mark is determined can be performed in accordance with user's intention.

<Embodiment of Method of Manufacturing Article>

A method of manufacturing an article according to an embodiment of the present invention is suitable for manufacturing an article such as a microdevice (for example, a semiconductor device) or an element having a microstructure. The method of manufacturing an article according to the embodiment includes a step of forming a pattern on a resin applied to a substrate by using the imprint apparatus (a step of performing the imprint process on the substrate), and a step of processing the substrate on which the pattern has been formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-114366 filed on Jun. 2, 2014, which is hereby incorporated by reference herein in its entirety.

What is claimed is:

1. An imprint apparatus that forms a pattern of an imprint material on a shot region of a substrate by using a mold, comprising:
   a detector configured to detect a position of each of a plurality of substrate-side marks provided to the shot region, and a position of each of a plurality of mold-side marks provided to the mold;
   a controller configured to
   predict a position of each of the plurality of substrate-side marks formed to the shot region, based on information about deformation of the shot region,
   cause the detector to detect a position of each of the plurality of substrate-side marks,
   obtain a substrate-side mark for which a difference between the detected position and the predicted position does not fall within an allowable range set in advance, among the plurality of substrate-side marks, and
   perform the alignment between the mold and the shot region based on the detected positions of substrate-side marks which are different from the obtained substrate-side mark.

2. The apparatus according to claim 1, wherein the controller performs the alignment based on the detection result for substrate-side marks other than the obtained substrate-side mark, among the plurality of substrate-side marks provided to the shot region.

3. The apparatus according to claim 1, wherein
   the substrate has a plurality of shot regions including a first shot region having the obtained substrate-side mark, and a second shot region having undergone an imprint process before the first shot region, and
   the controller performs the alignment in the first shot region by using, instead of the detection result for the obtained substrate-side mark, the detection result for a substrate-side mark that is provided to the second shot region and arranged at the same position in the shot region as a position of the obtained substrate-side mark.

4. The apparatus according to claim 1, wherein the controller performs the alignment in a shot region having the obtained substrate-side mark by using, instead of the detection result for the obtained substrate-side mark, the detection result for a substrate-side mark that is provided to a substrate having previously undergone an imprint process, and is arranged at the same position on the substrate as a position of the obtained substrate-side mark.

5. The apparatus according to claim 1, wherein
   in a case where the substrate-side mark for which the difference does not fall within the allowable range is obtained, the controller performs the alignment for a shot region having the obtained substrate-side mark in accordance with a mode selected from a plurality of modes, and
   the plurality of modes include at least one of a first mode in which the alignment is controlled based on the detection result for substrate-side marks other than the obtained substrate-side mark, a second mode in which the alignment is controlled by using, instead of the detected position for the obtained substrate-side mark, the detected position for a substrate-side mark provided to a shot region having previously undergone an imprint process, and a third mode in which the alignment is controlled by using, instead of the detected position for the obtained substrate-side mark, the detected position for a substrate-side mark provided to a substrate having previously undergone the imprint process.

6. The apparatus according to claim 1, wherein the information includes information on at least one of a deformation amount of the shot region to be generated when forming a substrate-side mark on the substrate, a deformation amount of the shot region upon a temperature change of the substrate, and a deformation amount of the shot region by holding the substrate.

7. The apparatus according to claim 1, wherein the controller obtains a predicted value on a position for each substrate-side mark provided to the shot region.

8. The apparatus according to claim 7, wherein the controller uses the predicted value commonly for a plurality of substrates.

9. The apparatus according to claim 1, wherein the information includes information about deformation of the shot region generated after the plurality of substrate-side marks have been formed on the shot region.

\* \* \* \* \*